US012568709B2

(12) United States Patent
Xu et al.

(10) Patent No.: US 12,568,709 B2
(45) Date of Patent: Mar. 3, 2026

(54) CONDUCTIVE LAYER AND PREPARATION METHOD THEREFOR, AND SOLAR CELL

(71) Applicant: TONGWEI SOLAR (ANHUI) CO., LTD., Anhui (CN)

(72) Inventors: Lei Xu, Hefei (CN); Jianfeng Xue, Hefei (CN); Kesheng Wei, Hefei (CN); Jin Wang, Hefei (CN)

(73) Assignee: TONGWEI SOLAR (CHENGDU) CO., LTD., Chengdu (CN)

( * ) Notice: Subject to any disclaimer, the term of this patent is extended or adjusted under 35 U.S.C. 154(b) by 2 days.

(21) Appl. No.: 18/565,924

(22) PCT Filed: Oct. 24, 2022

(86) PCT No.: PCT/CN2022/126912
§ 371 (c)(1),
(2) Date: Nov. 30, 2023

(87) PCT Pub. No.: WO2023/202016
PCT Pub. Date: Oct. 26, 2023

(65) Prior Publication Data
US 2024/0363785 A1     Oct. 31, 2024

(30) Foreign Application Priority Data
Apr. 18, 2022     (CN) .......................... 202210401548.1

(51) Int. Cl.
*H10F 71/10*          (2025.01)
*H10F 10/16*          (2025.01)
(Continued)

(52) U.S. Cl.
CPC ........... *H10F 71/138* (2025.01); *H10F 10/16* (2025.01); *H10F 10/164* (2025.01); *H10F 71/00* (2025.01); *H10F 71/10* (2025.01); *H10F 77/244* (2025.01)

(58) Field of Classification Search
None
See application file for complete search history.

(56) References Cited

U.S. PATENT DOCUMENTS

2008/0107799 A1* 5/2008 Lu .......................... H10F 77/70
257/E31.13

FOREIGN PATENT DOCUMENTS

CN          106571174 A          4/2017
CN          108878058 A          11/2018
(Continued)

OTHER PUBLICATIONS

Boccard, Mathieu et al., "Properties of hydrogenated indium oxide prepared by reactive sputtering with hydrogen gas" 2016 IEEE 43rd Photovoltaic Specialists Conference (PVSC) (pp. 2868-2870) (Year: 2016).*

(Continued)

*Primary Examiner* — Tamir Ayad
(74) *Attorney, Agent, or Firm* — Dority & Manning, P.A.

(57) ABSTRACT

A conductive layer, comprising a first TCO layer, a second TCO layer, a third TCO layer and a fourth TCO layer which are stacked. The first TCO layer is prepared in a first atmosphere, and the first atmosphere is a mixed gas of argon and hydrogen; the second TCO layer is prepared in a second atmosphere, the second atmosphere is a mixed gas of argon, hydrogen, and oxygen, a partial pressure gradient of hydrogen is reduced, and a partial pressure gradient of oxygen is increased; the third TCO layer is prepared in a third atmosphere, and the third atmosphere is a mixed gas of argon and oxygen; the fourth TCO layer is prepared in a fourth atmosphere, the fourth atmosphere is a mixed gas of argon and oxygen, and a partial pressure gradient of oxygen is decreased.

16 Claims, 2 Drawing Sheets

(51) Int. Cl.

| | | |
|---|---|---|
| *H10F 10/164* | (2025.01) | |
| *H10F 71/00* | (2025.01) | |
| *H10F 77/20* | (2025.01) | |

(56) References Cited

FOREIGN PATENT DOCUMENTS

| | | | | |
|---|---|---|---|---|
| CN | 109037383 | A | 12/2018 | |
| CN | 112186062 | A | 1/2021 | |
| CN | 112701181 | A | 4/2021 | |
| CN | 113005412 | A | 6/2021 | |
| CN | 214625056 | U | 11/2021 | |
| CN | 114171632 | A | 3/2022 | |
| CN | 114914311 | A | 8/2022 | |
| JP | 2009176927 | A | 8/2009 | |
| WO | WO-2009136863 | A1 * | 11/2009 | ......... C03C 17/3429 |

OTHER PUBLICATIONS

International Search Report for corresponding Application No. PCT/CN2022/126912, dated Jan. 12, 2023, 6 pages.
Chinese Search Report for Application No. CN202210401548 Dated Jan. 18, 2023.

* cited by examiner

CONDUCTIVE LAYER AND PREPARATION METHOD THEREFOR, AND SOLAR CELL

RELATED APPLICATION

This application is an U.S. national phase application under 35 U.S.C. § 371 based upon international patent application No. PCT/CN2022/126912 filed on Oct. 24, 2022, which itself claims priority to Chinese Patent Application No. 2022104015481, entitled "CONDUCTIVE LAYER AND PREPARATION METHOD THEREFOR, AND SOLAR CELL", filed on Apr. 18, 2022, the content of which is incorporated herein by reference in its entirety.

TECHNICAL FIELD

The present disclosure relates to the technical field of solar cells, particularly relates to a conductive layer, a method for preparing the conductive layer and a solar cell.

BACKGROUND

A heterojunction solar cell (HTJ cell for short) is a solar cell with a p-n junction consisting of two different types of semiconductor materials. Good passivated contact of HJT cell can minimize the carrier loading rate of the contact surface while maintaining good electrical performance of the cell.

In general, the HJT cell mainly involves the following process steps: (1) a crystalline silicon is textured and cleaned; (2) an intrinsic amorphous silicon layer and an N-doped amorphous silicon layer are deposited on the front side of the crystalline silicon; (3) an intrinsic amorphous silicon layer and a P-doped amorphous silicon layer are deposited on the backside of the crystalline silicon; (4) a transparent conductive film is deposited on the surface of the amorphous silicon layer; and (5) a metal electrode is made on the transparent conductive film. The step of depositing the transparent conductive film on the surface of the amorphous silicon layer is usually performed under argon and oxygen atmosphere, so as to adjust the resistance and transmittance of the transparent conductive film. However, the cell formed in this way has poor conductivity between the amorphous silicon layer and the transparent conductive film, thereby affecting the efficiency of the heterojunction cell.

SUMMARY

Accordingly, a conductive layer has good conductivity with amorphous silicon layer, high transmittance, and good conductive performance is provided in the present disclosure.

In one aspect of the present disclosure, a conductive layer including a first TCO layer, a second TCO layer, a third TCO layer, and a fourth TCO layer that are laminated is provided;

the first TCO layer is prepared under a first atmosphere, the first atmosphere is a mixed gas of argon and hydrogen;

the second TCO layer is prepared under a second atmosphere, the second atmosphere is a mixed gas of argon, hydrogen, and oxygen, during the preparation of the second TCO layer, a partial pressure of the hydrogen decreases in a gradient and a partial pressure of the oxygen increases in a gradient;

the third TCO layer is prepared under a third atmosphere, the third atmosphere is a mixed gas of argon and oxygen;

the fourth TCO layer is prepared under a fourth atmosphere, the fourth atmosphere is a mixed gas of argon and oxygen, during the preparation of the fourth TCO layer, a partial pressure of the oxygen decreases in a gradient;

a partial pressure of the oxygen in the third atmosphere is no less than a maximum partial pressure of the oxygen in the second atmosphere and a maximum partial pressure of the oxygen in the fourth atmosphere.

In some of embodiments, a partial pressure of the hydrogen in the first atmosphere is constant.

In some of embodiments, the partial pressure of the oxygen in the third atmosphere is constant.

In some of embodiments, the first TCO layer has a thickness ranging from 2 nm to 6 nm.

In some of embodiments, the second TCO layer has a thickness ranging from 4 nm to 10 nm.

In some of embodiments, the third TCO layer has a thickness ranging from 80 nm to 100 nm.

In some of embodiments, the fourth TCO layer has a thickness ranging from 5 nm to 10 nm.

In some of embodiments, the partial pressure of the hydrogen in the first atmosphere is 2% to 5%.

In some of embodiments, in the second atmosphere, the partial pressure of the hydrogen is 0 to 5%, and the partial pressure of the oxygen is 0 to 5%.

In some of embodiments, the partial pressure of the oxygen in the third atmosphere is 3% to 5%.

In some of embodiments, the partial pressure of the oxygen in the fourth atmosphere is 0 to 3%.

In some of embodiments, the partial pressure of the hydrogen in the second atmosphere decreases at a rate of 0.1%/s to 0.3%/s.

In some of embodiments, the partial pressure of the oxygen in the second atmosphere increases at a rate of 0.2%/s to 0.4%/s.

In some of embodiments, the partial pressure of the oxygen in the fourth atmosphere decreases at a rate of 0.1%/s to 0.2%/s.

In some of embodiments, a material of the conductive layer is one selected from the group consisting of indium tin oxide, zinc oxide, and tungsten-doped indium oxide.

In another aspect of the present disclosure, a method for preparing the aforementioned conductive layer is further provided, including the following steps:

preparing the first TCO layer under the first atmosphere;

preparing the second TCO layer on a surface of the first TCO layer under the second atmosphere;

preparing the third TCO layer on a surface of the second TCO layer under the third atmosphere; and preparing the fourth TCO layer on a surface of the third TCO layer under the fourth atmosphere.

In some of embodiments, the first TCO layer, the second TCO layer, the third TCO layer, and the fourth TCO layer are prepared by a physical vapor deposition process.

In another aspect of the present disclosure, a solar cell including the aforementioned conductive layer is further provided.

In some of embodiments, the solar cell is a heterojunction cell including: a silicon substrate, the conductive layer, and a metal electrode, the conductive layer is provided on at least one surface of the silicon substrate, the metal electrode is provided on a surface of the conductive layer away from the silicon substrate, and the first TCO layer of the conductive layer is arranged adjacent to the silicon substrate.

The aforementioned conductive layer includes the first TCO layer, the second TCO layer, the third TCO layer, and the fourth TCO layer that are laminated. By adjusting the preparation atmosphere of different TCO layers, the prepared first TCO layer has good conductivity with amorphous silicon, the third TCO layer has high transmittance. The second TCO layer achieves the connection of the TCO layers from low oxygen level to high oxygen level, the contact between the film layers is improved. The fourth TCO layer has good contact with metal. Therefore, the aforementioned conductive layer has good conductivity with amorphous silicon layer, high transmittance, and good conductive performance, and can improve the cell efficiency when applied to the heterojunction cell.

The details of one or more embodiments of the present disclosure are set forth in the accompanying drawings and the description below. Other features, objects and advantages of the present disclosure will become apparent from the description, the accompanying drawings, and the claims.

BRIEF DESCRIPTION OF THE DRAWINGS

To illustrate the technical solutions according to the embodiments of the present invention or in the conventional art more clearly, the accompanying drawings for describing the embodiments or the conventional art are introduced briefly in the following. Apparently, the accompanying drawings in the following description are only some embodiments of the present invention, and persons of ordinary skill in the art can derive other drawings from the accompanying drawings without creative efforts.

Figure 1:
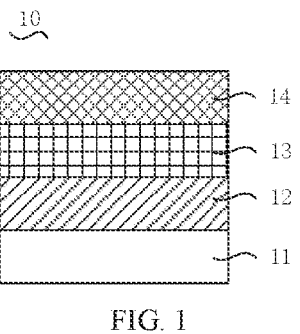
FIG. 1 is a schematic view of a conductive layer according to one embodiment of the present disclosure.

Reference Numerals: 10, conductive layer; 11, first TCO layer; 12, second TCO layer; 13, third TCO layer; 14, fourth TCO layer; 100, heterojunction cell; 20, silicon substrate; 21, P-doped amorphous silicon layer; 22, first intrinsic amorphous silicon layer; 23, crystalline silicon substrate; 24, second intrinsic amorphous silicon layer; 25, N-doped amorphous silicon layer; 30, metal electrode.

DETAILED DESCRIPTION OF EMBODIMENTS

The technical solutions in the embodiments of the present disclosure will be clearly and completely described hereinafter in combination with the accompanying drawings in the embodiments of the present disclosure. Obviously, the described embodiments are only a part of the embodiments of the present disclosure, but not all of the embodiments. All other embodiments obtained by a person of ordinary skill in the art based on the embodiments in the present disclosure without creative efforts are within the scope of the present disclosure.

In the description of the present disclosure, it should be understood that the terms "first" and "second" are used for descriptive purposes only, and cannot be understood to indicate or imply relative importance or implicitly indicate the number of technical features indicated. Therefore, the features defined with "first" and "second" may explicitly or implicitly include at least one of the features. In the description of the present disclosure, "plurality" means at least two, such as two, three, etc., unless otherwise specifically defined.

All technical and scientific terms used herein have the same meaning as commonly understood by one of ordinary skill in the art to which the present disclosure applies, unless otherwise defined. The terms used in the specification of the present disclosure herein are for the purpose of describing specific embodiments only and are not intended to limit the present disclosure. The term "and/or" used herein includes any and all combinations of one or more of the associated listed items.

Researchers has found that when the transparent conductive film is deposited on the surface of amorphous silicon layer under argon and oxygen atmosphere, the conductivity between the amorphous silicon layer of the resulting heterojunction cell and the transparent conductive film is deteriorated, which is mainly due to the oxidation of the amorphous silicon layer caused by both oxygen and free interstitial oxygen in the transparent conductive film.

Referring to FIG. 1, a transparent conductive oxide (TCO) layer including a first TCO layer 11, a second TCO layer 12, a third TCO layer 13, and a fourth TCO layer 14 that are laminated is provided according to one embodiment of the present disclosure.

A conductive layer 10 including the first TCO layer 11, the second TCO layer 12, the third TCO layer 13, and the fourth TCO layer 14 that are laminated is provided according to one embodiment of the present disclosure. The term "TCO" refers to and is short for transparent conductive oxide.

The first TCO layer 11 is prepared under a first atmosphere, the first atmosphere is a mixed gas of argon and hydrogen. Specifically, a partial pressure of the hydrogen in the first atmosphere is constant. By preparing the first TCO layer 11 under the aforementioned reductive first atmosphere containing hydrogen, the interstitial oxygen in the first TCO layer 11 is less, which not only can avoid oxidation of the amorphous silicon layer in a heterojunction cell 100, but also can improve the contact between the first TCO layer 11 and the amorphous silicon layer, such that the conductivity between the conductive layer 10 and the amorphous silicon layer is better.

The second TCO layer 12 is prepared under a second atmosphere, the second atmosphere is a mixed gas of argon, hydrogen, and oxygen. During the preparation of the second TCO layer 12, a partial pressure of the hydrogen decreases in a gradient, and a partial pressure of the oxygen increases in a gradient. By adjusting the partial pressure of the hydrogen and the oxygen in the second atmosphere in a gradient, the connection from low oxygen level to high oxygen level is achieved in the second TCO layer 12, and a matching of work function between the film layers is achieved, such that the contact between each film layer in the conductive layer 10 is improved.

It should be understood that, in embodiments of the present disclosure, "decrease in a gradient" or "increase in a gradient" means that during preparation, the partial pressure of the gas changes in a certain direction, which can change in a gradient with a certain amount of change, or can change linearly with a certain rate.

The third TCO layer 13 is prepared under a third atmosphere, the third atmosphere is a mixed gas of argon and oxygen. A partial pressure of the oxygen in the third atmosphere is no less than a maximum partial pressure of the oxygen in the second atmosphere and a maximum partial pressure of the oxygen in the fourth atmosphere. Specifically, the partial pressure of the oxygen in the third atmosphere is constant. The third TCO layer 13 is prepared under relatively high partial pressure of oxygen, such that the third TCO layer 13 has relatively high transmittance, and the overall transmittance of the conductive layer 10 is improved.

The fourth TCO layer 14 is prepared under a fourth atmosphere, the fourth atmosphere is a mixed gas of argon and oxygen. During the preparation of the fourth TCO layer 14, a partial pressure of the oxygen decreases in a gradient. Since the partial pressure of the oxygen decreases in a gradient during the preparation of the fourth TCO layer 14, the contact between the fourth TCO layer 14 and metal is good, and the conductivity of the conductive layer 10 is improved.

In the aforementioned conductive layer 10, the interstitial oxygen in the first TCO layer 11 is the lowest. The interstitial oxygen in the second TCO layer 12 gradually increases in a direction from the first TCO layer 11 to the third TCO layer 13, thus achieving the connection from low oxygen level to high oxygen level. The interstitial oxygen in the third TCO layer 13 is more than that in the first TCO layer 11, the second TCO layer 12, and the fourth TCO layer 14. The interstitial oxygen in the fourth TCO layer 14 gradually decreases from the third TCO layer 13 towards outside.

Therefore, by adjusting the preparation atmosphere of different TCO layers of the conductive layer 10, the prepared first TCO layer 11 has good conductivity with amorphous silicon, the third TCO layer 13 has high transmittance. The second TCO layer 12 achieves the connection of the TCO layers from low oxygen level to high oxygen level, the contact between the film layers is improved. The fourth TCO layer 14 has good contact with metal. As a result, the aforementioned conductive layer 10 has good conductivity with amorphous silicon layer, high transmittance, and good conductive performance, and can improve the cell efficiency when applied to the heterojunction cell.

In some of embodiments, the first TCO layer 11 has a thickness ranging from 2 nm to 6 nm. Optionally, the first TCO layer 11 has the thickness of 2 nm, 3 nm, 4 nm, 5 nm, or 6 nm.

In some of embodiments, the second TCO layer 12 has a thickness ranging from 4 nm to 10 nm. Optionally, the second TCO layer 12 has the thickness of 4 nm, 5 nm, 6 nm, 7 nm, 8 nm, 9 nm, or 10 nm.

In some of embodiments, the third TCO layer 13 has a thickness ranging from 80 nm to 100 nm. Optionally, the third TCO layer 13 has the thickness of 80 nm, 85 nm, 90 nm, 95 nm, or 100 nm.

In some of embodiments, the fourth TCO layer 14 has a thickness ranging from 5 nm to 10 nm. Optionally, the fourth TCO layer 14 has the thickness of 5 nm, 6 nm, 7 nm, 8 nm, 9 nm, or 10 nm.

In some of embodiments, the partial pressure of the hydrogen in the first atmosphere is 2% to 5%. Optionally, the partial pressure of the hydrogen in the first atmosphere is 2%, 3%, 4%, or 5%.

In some of embodiments, in the second atmosphere, the partial pressure of the hydrogen is 0 to 5%, and the partial pressure of the oxygen is 0 to 5%. Specifically, a minimum partial pressure of the hydrogen in the second atmosphere ranges from 0 to 1%. A maximum partial pressure of the hydrogen in the second atmosphere ranges from 2% to 5%. Furthermore, an initial partial pressure (i.e., maximum) of the hydrogen in the second atmosphere is the same as the partial pressure of the hydrogen in the first atmosphere. Specifically, a minimum partial pressure of the oxygen in the second atmosphere ranges from 0 to 1%. A maximum partial pressure of the oxygen in the second atmosphere ranges from 3% to 5%. Furthermore, the maximum partial pressure of the oxygen in the second atmosphere is the same as the partial pressure of the oxygen in the third atmosphere.

In some of embodiments, the partial pressure of the hydrogen in the second atmosphere decreases at a rate of 0.1%/s to 0.3%/s. The partial pressure of the oxygen in the second atmosphere increases at a rate of 0.2%/s to 0.4%/s.

In some of embodiments, the partial pressure of the oxygen in the third atmosphere is 3% to 5%. Optionally, the partial pressure of the oxygen in the third atmosphere is 3%, 3.5%, 4%, 4.5%, or 5%.

In some of embodiments, the partial pressure of the oxygen in the fourth atmosphere is 0 to 3%. Specifically, a minimum partial pressure of the oxygen in the fourth atmosphere ranges from 0 to 1%. A maximum partial pressure of the oxygen in the fourth atmosphere ranges from 2% to 3%. In some of embodiments, the partial pressure of the oxygen in the fourth atmosphere decreases at a rate of 0.1%/s to 0.2%/s.

In some of embodiments, a material of the conductive layer 10 is one selected from the group consisting of indium tin oxide (ITO), zinc oxide (AZO), and tungsten-doped indium oxide (IWO).

A method for preparing the aforementioned conductive layer 10 is further provided according to another embodiment of the present disclosure, including the following steps S110 to S140.

Step S110: the first TCO layer 11 is prepared under the first atmosphere, the first atmosphere is the mixed gas of argon and hydrogen.

In some of embodiments, the partial pressure of the hydrogen in the first atmosphere in step S110 is 2% to 5%.

In some of embodiments, the first TCO layer 11 has the thickness ranging from 2 nm to 6 nm. Optionally, the first TCO layer 11 has the thickness of 2 nm, 3 nm, 4 nm, 5 nm, or 6 nm.

Step S120: the second TCO layer 12 is prepared on a surface of the first TCO layer 11 under the second atmosphere, the second atmosphere is the mixed gas of argon, hydrogen, and oxygen, and the partial pressure of the hydrogen decreases in a gradient and the partial pressure of the oxygen increases in a gradient.

In some of embodiments, in the second atmosphere in step S120, the partial pressure of the hydrogen is 0 to 5%, and the partial pressure of the oxygen is 0 to 5%. In some of embodiments, the partial pressure of the hydrogen in the second atmosphere decreases at a rate of 0.1%/s to 0.3%/s. The partial pressure of the oxygen in the second atmosphere increases at a rate of 0.2%/s to 0.4%/s.

In some of embodiments, the second TCO layer 12 has the thickness ranging from 4 nm to 10 nm. Optionally, the second TCO layer 12 has the thickness of 4 nm, 5 nm, 6 nm, 7 nm, 8 nm, 9 nm, or 10 nm.

Step S130: the third TCO layer 13 is prepared on a surface of the second TCO layer 12 under the third atmosphere, the third atmosphere is the mixed gas of argon and oxygen. The partial pressure of the oxygen in the third atmosphere is no less than the partial pressure of the oxygen in the second atmosphere and the partial pressure of the oxygen in the fourth atmosphere.

In some of embodiments, the partial pressure of the oxygen in the third atmosphere in step S130 is 3% to 5%.

In some of embodiments, the third TCO layer 13 has the thickness ranging from 80 nm to 100 nm. Optionally, the third TCO layer 13 has the thickness of 80 nm, 85 nm, 90 nm, 95 nm, or 100 nm.

Step S140: the fourth TCO layer 14 is prepared on a surface of the third TCO layer 13 under the fourth atmosphere, the fourth atmosphere is the mixed gas of argon and oxygen, and the partial pressure of the oxygen decreases in a gradient.

In some of embodiments, the partial pressure of the oxygen in the fourth atmosphere in step S140 is 0 to 3%. In some of embodiments, the partial pressure of the oxygen in the fourth atmosphere decreases at a rate of 0.1%/s to 0.2%/s.

In some of embodiments, the fourth TCO layer 14 has the thickness ranging from 5 nm to 10 nm. Optionally, the fourth TCO layer 14 has the thickness of 5 nm, 6 nm, 7 nm, 8 nm, 9 nm, or 10 nm.

The aforementioned method for preparing the conductive layer 10 is simple to operate. By adjusting the partial pressure of hydrogen and oxygen during the preparation, the conductive layer 10 with relatively high transmittance, relatively good conductive performance, and good conductive contact with heterojunction cell assembly can be prepared.

In some of embodiments, the transparent oxide layer is prepared by a physical vapor deposition (PVD) process. Specifically, the physical vapor deposition process can be selected from vacuum evaporation process, sputter coating process, and plasma coating process. Specifically, the parameters of the physical vapor deposition process are as follows: power density 15 W/cm to 75 W/cm, deposition rate 0.3 nm/s to 1.5 nm/s, deposition pressure 0.6 Pa to 1.0 Pa, deposition temperature 95° C. to 105° C.

In some of embodiments, the material of the conductive layer 10 is one selected from the group consisting of indium tin oxide (ITO), zinc oxide (AZO), and tungsten-doped indium oxide (IWO).

A solar cell including the aforementioned conductive layer 10 is further provided according to another embodiment of the present disclosure.

Figure 2:
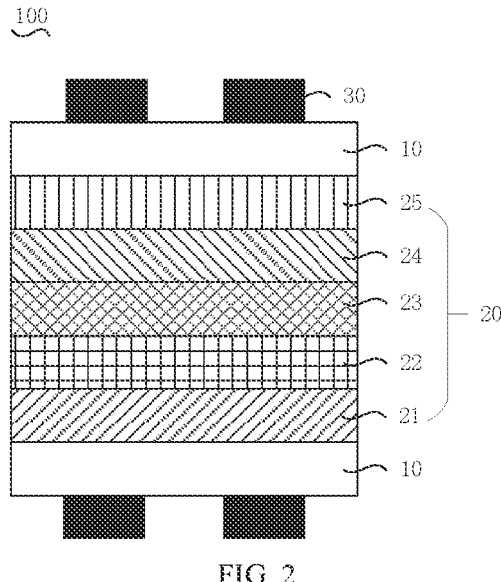
FIG. 2 is a schematic view of a heterojunction cell according to one embodiment of the present disclosure.

In one embodiment, the solar cell is a heterojunction cell. Referring to FIG. 2 for an example of the heterojunction cell 100, it includes a silicon substrate 20, the conductive layer 10, and a metal electrode 30. The conductive layer 10 is provided on at least one surface of the silicon substrate 20, and the metal electrode 30 is provided on a surface of the conductive layer 10 away from the silicon substrate 20. The conductive layer 10 is the conductive layer described above, and the first TCO layer 11 of the conductive layer 10 is arranged adjacent to the silicon substrate 20.

Specifically, the silicon substrate 20 includes a P-doped amorphous silicon layer 21, a first intrinsic amorphous silicon layer 22, a crystalline silicon substrate 23, a second intrinsic amorphous silicon layer 24 and an N-doped amorphous silicon layer 25 that are laminated.

The aforementioned heterojunction cell 100 includes the aforementioned conductive layer 10. The transparent oxide layer not only has relatively high transmittance and relatively good conductive performance, but also has good contact with the amorphous silicon layer and the metal electrode 30. Therefore, the heterojunction cell 100 has relatively high conversion efficiency.

A method for preparing the aforementioned heterojunction cell 100 is further provided according to another embodiment of the present disclosure, including the following steps S210 to S230.

Step S210: the silicon substrate 20 is prepared for backup.

Specifically, a method for preparing the silicon substrate 20 includes the following steps S211 to S213.

Step S211: the crystalline silicon substrate 23 is textured and cleaned.

Step S212: the first intrinsic amorphous silicon layer 22 and the P-doped amorphous silicon layer 21 are successively deposited on a backside of the textured crystalline silicon substrate 23.

Step S213: the second intrinsic amorphous silicon layer 24 and the N-doped amorphous silicon layer 25 are successively deposited on a front side of the textured crystalline silicon substrate 23.

Specifically, Step S212 and Step S213 can be performed by a plasma enhanced chemical vapor deposition (PECVD) process.

Step S220: the conductive layer 10 is prepared on a surface of the silicon substrate 20. Step S220 includes the aforementioned steps S110 to S140.

Step S230: the metal electrode 30 is prepared on the surface of the conductive layer 10 away from the silicon substrate 20.

Specifically, step S230 can be performed by a screen printing process.

In the method for preparing the aforementioned heterojunction cell 100, by adjusting the partial pressure of the hydrogen and the oxygen in the preparation environment of the conductive layer 10, the oxidation of the amorphous silicon layer of the heterojunction cell 100 can be avoided. Meanwhile, by adjusting the partial pressure of the hydrogen and the oxygen in the preparation environment of the conductive layer 10, the conductive layer 10 has good contact with the silicon substrate 20 and the metal electrode 30 in the heterojunction cell 100, the transparent conductive layer has relatively high transmittance and relatively good conductivity, and the heterojunction cell 100 has relatively high efficiency.

The conductive layer, the heterojunction cell and the preparation method therefor of the present disclosure are further illustrated below by specific embodiments.

Example 1

The heterojunction cell of this example was prepared by the following steps, in which the material of the conductive layer was ITO:

(1) an N-type monocrystalline silicon wafer with a thickness of 150 μm was textured and cleaned, and a textured surface was prepared.

(2) an intrinsic amorphous silicon layer and an N-doped amorphous silicon layer were successively deposited on the front side of the silicon wafer prepared in (1) by PECVD process, and an intrinsic amorphous silicon layer and a P-doped amorphous silicon layer were successively deposited on the backside of the silicon wafer.

(3) a first TCO layer with a thickness of 3 nm was prepared on surfaces of the N/P-doped amorphous silicon layer by magnetron sputtering process with process gas of Ar and $H_2$, and the process parameters were as follows: power density 15 W/cm, deposition rate 0.3 nm/s, deposition pressure 0.8 Pa, deposition temperature 100° C., partial pressure of $H_2$ 2%.

(4) a second TCO layer with a thickness of 5 nm was prepared on a surface of the first TCO layer by magnetron sputtering process with process gas of Ar, $H_2$, and $O_2$, and the process parameters were as follows: power density 25 W/cm, deposition rate 0.5 nm/s, deposition pressure 0.8 Pa, deposition temperature 100° C., initial partial pressure of $H_2$ 2%, decrease rate 0.2%/s, initial partial pressure of $O_2$ 0, increase rate 0.4%/s.

(5) a third TCO layer with a thickness of 90 nm was prepared on a surface of the second TCO layer by magnetron sputtering process with process gas of Ar and $O_2$, and the process parameters were as follows: power density 75 W/cm, deposition rate 1.5 nm/s, deposition pressure 0.8 Pa, deposition temperature 100° C., partial pressure of $O_2$ 4%.

(6) a fourth TCO layer with a thickness of 7 nm was prepared on a surface of the third TCO layer by magnetron sputtering process with process gas of Ar and $O_2$, and the process parameters were as follows: power density 35 W/cm, deposition rate 0.7 nm/s, deposition pressure 0.8 Pa, deposition temperature 100° C., initial partial pressure of $O_2$ 4%, decrease rate 0.1%/s.

(7) an Ag metal electrode was prepared and solidified on a surface of the fourth TCO layer by screen printing process.

Example 2

The heterojunction cell of this example was prepared by the following steps, in which the material of the conductive layer was ITO:

(1) an N-type monocrystalline silicon wafer with a thickness of 150 μm was textured and cleaned, and a textured surface was prepared.

(2) an intrinsic amorphous silicon layer and an N-doped amorphous silicon layer were successively deposited on the front side of the silicon wafer prepared in (1) by PECVD process, and an intrinsic amorphous silicon layer and a P-doped amorphous silicon layer were successively deposited on the backside of the silicon wafer.

(3) a first TCO layer with a thickness of 5 nm was prepared on surfaces of the N/P-doped amorphous silicon layer by magnetron sputtering process with process gas of Ar and $H_2$, and the process parameters were as follows: power density 15 W/cm, deposition rate 0.3 nm/s, deposition pressure 0.8 Pa, deposition temperature 100° C., partial pressure of $H_2$ 2%.

(4) a second TCO layer with a thickness of 8 nm was prepared on a surface of the first TCO layer by magnetron sputtering process with process gas of Ar, $H_2$, and $O_2$, and the process parameters were as follows: power density 25 W/cm, deposition rate 0.5 nm/s, deposition pressure 0.8 Pa, deposition temperature 100° C., initial partial pressure of $H_2$ 2%, decrease rate 0.125%/s, initial partial pressure of $O_2$ 0, increase rate 0.25%/s.

(5) a third TCO layer with a thickness of 82 nm was prepared on a surface of the second TCO layer by magnetron sputtering process with process gas of Ar and $O_2$, and the process parameters were as follows: power density 75 W/cm, deposition rate 1.5 nm/s, deposition pressure 0.8 Pa, deposition temperature 100° C., partial pressure of $O_2$ 4%.

(6) a fourth TCO layer with a thickness of 10 nm was prepared on a surface of the third TCO layer by magnetron sputtering process with process gas of Ar and $O_2$, and the process parameters were as follows: power density 35 W/cm, deposition rate 0.7 nm/s, deposition pressure 0.8 Pa, deposition temperature 100° C., initial partial pressure of $O_2$ 4%, decrease rate 0.28%/s.

(7) an Ag metal electrode was prepared and solidified on a surface of the fourth TCO layer by screen printing process.

Comparative Example 1

The heterojunction cell of this comparative example was prepared by the following steps, in which the material of the conductive layer was ITO:

(1) an N-type monocrystalline silicon wafer with a thickness of 150 μm was textured and cleaned, and a textured surface was prepared.

(2) an intrinsic amorphous silicon layer and an N-doped amorphous silicon layer were successively deposited on the front side of the silicon wafer prepared in (1) by PECVD process, and an intrinsic amorphous silicon layer and a P-doped amorphous silicon layer were successively deposited on the backside of the silicon wafer.

(3) a conductive layer with a thickness of 110 nm was prepared on surfaces of the N/P-doped amorphous silicon layer by magnetron sputtering process with process gas of Ar and $O_2$, and the process parameters were as follows: power density 75 W/cm, deposition rate 1.5 nm/s, deposition pressure 0.8 Pa, deposition temperature 100° C., partial pressure of $O_2$ 3%.

(4) an Ag metal electrode was prepared and solidified on a surface of the conductive layer by screen printing process.

Comparative Example 2

The heterojunction cell of this comparative example was prepared by the following steps, in which the material of the conductive layer was ITO:

(1) an N-type monocrystalline silicon wafer with a thickness of 150 μm was textured and cleaned, and a textured surface was prepared.

(2) an intrinsic amorphous silicon layer and an N-doped amorphous silicon layer were successively deposited on the front side of the silicon wafer prepared in (1) by PECVD process, and an intrinsic amorphous silicon layer and a P-doped amorphous silicon layer were successively deposited on the backside of the silicon wafer.

(3) a first TCO layer with a thickness of 3 nm was prepared on surfaces of the N/P-doped amorphous silicon layer by magnetron sputtering process with process gas of Ar and $H_2$, and the process parameters were as follows: power density 15 W/cm, deposition rate 0.3 nm/s, deposition pressure 0.8 Pa, deposition temperature 100° C., partial pressure of $H_2$ 2%.

(4) a third TCO layer with a thickness of 102 nm was prepared on a surface of the first TCO layer by magnetron sputtering process with process gas of Ar and $O_2$, and the process parameters were as follows: power density 75 W/cm, deposition rate 1.5 nm/s, deposition pressure 0.8 Pa, deposition temperature 100° C., partial pressure of $O_2$ 3%.

(5) an Ag metal electrode was prepared and solidified on a surface of the third TCO layer by screen printing process.

Comparative Example 3

The heterojunction cell of this comparative example was prepared by the following steps, in which the material of the conductive layer was ITO:

(1) an N-type monocrystalline silicon wafer with a thickness of 150 μm was textured and cleaned, and a textured surface was prepared.

(2) an intrinsic amorphous silicon layer and an N-doped amorphous silicon layer were successively deposited on the front side of the silicon wafer prepared in (1) by PECVD process, and an intrinsic amorphous silicon layer and a P-doped amorphous silicon layer were successively deposited on the backside of the silicon wafer.

(3) a second TCO layer with a thickness of 5 nm was prepared on surfaces of the N/P-doped amorphous silicon by magnetron sputtering process with process gas of Ar, $H_2$, and $O_2$, and the process parameters were as follows: power density 25 W/cm, deposition rate 0.5 nm/s, deposition pressure 0.8 Pa, deposition temperature 100° C., initial partial pressure of $H_2$ 2%, decrease rate 0.2%/s, initial partial pressure of $O_2$ 0, increase rate 0.3%/s.

(4) a third TCO layer with a thickness of 93 nm was prepared on a surface of the second TCO layer by magnetron sputtering process with process gas of Ar and $O_2$, and the process parameters were as follows: power density 75 W/cm, deposition rate 1.5 nm/s, deposition pressure 0.8 Pa, deposition temperature 100° C., partial pressure of $O_2$ 3%.

(5) a fourth TCO layer with a thickness of 7 nm was prepared on a surface of the third TCO layer by magnetron sputtering process with process gas of Ar and $O_2$, and the process parameters were as follows: power density 35 W/cm, deposition rate 0.7 nm/s, deposition pressure 0.8 Pa, deposition temperature 100° C., initial partial pressure of $O_2$ 3%, decrease rate 0.1%/s.

(6) an Ag metal electrode was prepared and solidified on a surface of the fourth TCO layer by screen printing process.

The electrical performances of the heterojunction cells prepared in Examples 1 to 2 and Comparative Examples 1 to 3 were tested respectively, and the test results are recorded in Table 1.

TABLE 1

| the electrical performances of the heterojunction cells of Examples 1 to 2 and Comparative Examples 1 to 3 (normalized based on the data of Comparative Example 1). | | | | | | |
|---|---|---|---|---|---|---|
| Example | Eff/% | Isc/% | Voc/% | FF/% | Rs/% | Rsh/% |
| Comparative Example 1 | 100.00 | 100.00 | 100.00 | 100.00 | 100.00 | 100.00 |
| Comparative Example 2 | 100.30 | 99.92 | 100.03 | 100.35 | 95.45 | 100.16 |
| Comparative Example 3 | 100.14 | 99.94 | 99.97 | 100.23 | 90.83 | 101.34 |
| Example 1 | 100.43 | 100.26 | 100.04 | 100.12 | 90.38 | 101.79 |
| Example 2 | 100.65 | 100.18 | 100.05 | 100.42 | 89.07 | 110.01 |

As can be seen from the relevant data in Table 1, relative to the heterojunction cell prepared by the conventional method in Comparative Example 1, the series resistances Rs of the heterojunction cells prepared in Examples 1 to 2 decrease, the parallel resistances Rsh increase, and the open-circuit voltages Voc, short-circuit currents Isc, and fill factors FF all increase. In summary, the photoelectric conversion efficiencies of the heterojunction cells prepared in Examples 1 to 2 increase by 0.43% to 0.65% compared to the heterojunction cell in Comparative Example 1.

In the Comparative Example 2, the first TCO layer is added based on Comparative Example 1, and in the Comparative Example 3, the second TCO layer and the fourth TCO layer are added based on Comparative Example 1, such that the short-circuit currents Isc slightly decrease and the fill factors FF significantly increase. In summary, the photoelectric conversion efficiencies of the heterojunction cells in Comparative Examples 2 and 3 increase by 0.14% to 0.3% compared to the heterojunction cell in Comparative Example 1, but are inferior to the heterojunction cells in Examples 1 to 2.

Each of the technical features of the above-mentioned examples may be combined arbitrarily, to simplify the description, not all the possible combinations of each of the technical features in the above examples are described, however, all of the combinations of these technical features should be considered as within the scope of this disclosure, as long as such combinations do not contradict with each other.

The above embodiments merely illustrate several embodiments of the present disclosure, and the description thereof is specific and detailed, but it shall not be constructed as limiting the scope of the present disclosure. It should be noted that a plurality of variations and modifications may be made by those skilled in the art without departing from the scope of this disclosure, which are all within the scope of protection of this disclosure. Therefore, the protection scope of this disclosure shall be subject to the appended claims.

What is claimed is:

1. A method for preparing a heterojunction solar cell, comprising: preparing an amorphous silicon layer on a surface of a silicon substrate; preparing, on a surface of the amorphous silicon layer, a first transparent conductive oxide (TCO) layer under a first atmosphere, wherein the first atmosphere is a mixed gas consisting of argon and hydrogen;

preparing a second TCO layer on a surface of the first TCO layer under a second atmosphere, wherein the second atmosphere is a mixed gas consisting of argon, hydrogen, and oxygen, a partial pressure of the hydrogen decreases in a gradient, and a partial pressure of the oxygen increases in a gradient;

preparing a third TCO layer on a surface of the second TCO layer under a third atmosphere, wherein the third atmosphere is a mixed gas consisting of argon and oxygen; and preparing a fourth TCO layer on a surface of the third TCO layer under a fourth atmosphere, wherein the fourth atmosphere is a mixed gas consisting of argon and oxygen, and a partial pressure of the oxygen decreases in a gradient;

wherein a partial pressure of the oxygen in the third atmosphere is no less than a maximum partial pressure of the oxygen in the second atmosphere and a maximum partial pressure of the oxygen in the fourth atmosphere.

2. The method for preparing a heterojunction solar cell according to claim 1 wherein the first TCO layer, the second TCO layer, the third TCO layer, and the fourth TCO layer are prepared by a physical vapor deposition process.

3. The method for preparing a heterojunction solar cell according to claim 1 wherein a partial pressure of the hydrogen in the first atmosphere is constant.

4. The method for preparing a heterojunction solar cell according to claim 1 wherein the partial pressure of the oxygen in the third atmosphere is constant.

5. The method for preparing a heterojunction solar cell according to claim 1 wherein the first TCO layer has a thickness ranging from 2 nm to 6 nm.

6. The method for preparing a heterojunction solar cell according to claim 1 wherein the second TCO layer has a thickness ranging from 4 nm to 10 nm.

7. The method for preparing a heterojunction solar cell according to claim 1 wherein the third TCO layer has a thickness ranging from 80 nm to 100 nm.

8. The method for preparing a heterojunction solar cell according to claim 1 wherein the fourth TCO layer has a thickness ranging from 5 nm to 10 nm.

9. The method for preparing a heterojunction solar cell according to claim 1 wherein the partial pressure of the hydrogen in the first atmosphere is 2% to 5%.

10. The method for preparing a heterojunction solar cell according to claim 1 wherein in the second atmosphere, the partial pressure of the hydrogen is 1 to 5%, and the partial pressure of the oxygen is 1 to 5%.

11. The method for preparing a heterojunction solar cell according to claim 1 wherein the partial pressure of the oxygen in the third atmosphere is 3% to 5%.

12. The method for preparing a heterojunction solar cell according to claim 1 wherein the partial pressure of the oxygen in the fourth atmosphere is 1 to 3%.

13. The method for preparing a heterojunction solar cell according to claim 1 wherein the partial pressure of the hydrogen in the second atmosphere decreases at a rate of 0.1%/s to 0.3%/s.

14. The method for preparing a heterojunction solar cell according to claim 1 wherein the partial pressure of the oxygen in the second atmosphere increases at a rate of 0.2%/s to 0.4%/s.

15. The method for preparing a heterojunction solar cell according to claim 1 wherein the partial pressure of the oxygen in the fourth atmosphere decreases at a rate of 0.1%/s to 0.2%/s.

16. The method for preparing a heterojunction solar cell according to claim 1 wherein a material of the conductive layer is one selected from the group consisting of indium tin oxide, zinc oxide, and tungsten-doped indium oxide.

* * * * *